(12) United States Patent
Shirai et al.

(10) Patent No.: US 9,535,330 B2
(45) Date of Patent: Jan. 3, 2017

(54) STRIPPING SOLUTION FOR PHOTOLITHOGRAPHY AND PATTERN FORMATION METHOD

(71) Applicant: Tokyo Ohka Kogyo Co., Ltd., Kawasaki-shi (JP)

(72) Inventors: Yuriko Shirai, Kawasaki (JP); Naohisa Ueno, Kawasaki (JP); Takuya Ohhashi, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 13/664,054

(22) Filed: Oct. 30, 2012

(65) Prior Publication Data

US 2013/0126470 A1    May 23, 2013

(30) Foreign Application Priority Data

Nov. 1, 2011   (JP) ................... 2011-240449

(51) Int. Cl.
  *C09K 13/06*   (2006.01)
  *C09K 13/08*   (2006.01)
  *G03F 7/42*    (2006.01)

(52) U.S. Cl.
  CPC .............. *G03F 7/425* (2013.01); *G03F 7/423* (2013.01)

(58) Field of Classification Search
  CPC ............ G03F 7/422; G03F 7/425; C23F 1/14; C23F 1/16
  USPC .......................... 252/79.3, 79; 510/175, 176
  See application file for complete search history.

(56) References Cited

U.S. PATENT DOCUMENTS

| 2006/0014656 A1* | 1/2006 | Egbe et al. .................. 510/175 |
| 2006/0234516 A1* | 10/2006 | Hong et al. .................. 438/765 |
| 2008/0011714 A1 | 1/2008 | Yokoi et al. |
| 2008/0053956 A1* | 3/2008 | Gomez .................. C03C 17/06 216/41 |
| 2008/0171682 A1* | 7/2008 | Kane et al. .................. 510/176 |
| 2011/0118165 A1* | 5/2011 | Lee .................. G03F 7/426 510/176 |

FOREIGN PATENT DOCUMENTS

| CN | 1402090 A | 3/2003 |
| JP | H9-197681 | 7/1997 |
| JP | 2000-047401 | 2/2000 |
| JP | 2000-181083 | 6/2000 |
| JP | 2001-083713 | 3/2001 |
| JP | 2007-519942 A | 7/2007 |
| WO | WO 2005/057281 A2 | 6/2005 |
| WO | WO 2006/129549 A1 | 12/2006 |

OTHER PUBLICATIONS

Notice of Reasons for Rejection in Japanese Patent Application No. 2011-240449, mailed May 26, 2015.
Office Action in Taiwanese Patent Application No. 101140303, dated May 5, 2016.

* cited by examiner

*Primary Examiner* — Thomas Pham
(74) *Attorney, Agent, or Firm* — Knobbe Martens Olson & Bear LLP

(57) ABSTRACT

A stripping solution for photolithography including hydrofluoric acid, a basic compound represented by general formula (b-1), and water. In the formula, $R^{1b}$ to $R^{5b}$ represent a hydrogen atom, an alkyl group having 1 to 6 carbon atoms or the like, and at least one of $R^{1b}$ to $R^{5b}$ represents a hydrogen atom. One of $R^{1b}$ to $R^{4b}$ may bind with $R^{5b}$ to form a ring structure. $Y^{1b}$ and $Y^{2b}$ represent an alkylene group having 1 to 3 carbon atoms, and n is an integer of 0 to 5.

$$\begin{array}{c} R^{1b} \\ \diagdown \\ N-(Y^{1b}-N)_{n}-Y^{2b}-N \\ \diagup \phantom{xxxxx} | \phantom{xxxxx} \diagup \\ R^{2b} \phantom{xxxx} R^{5b} \phantom{xxxx} R^{4b} \end{array} \quad R^{3b} \diagdown \diagup R^{4b}$$ (b-1)

3 Claims, No Drawings

STRIPPING SOLUTION FOR PHOTOLITHOGRAPHY AND PATTERN FORMATION METHOD

This application is claims priority to Japanese Patent Application No. 2011-240449, filed Nov. 1, 2011, the entire content of which is incorporated herein by reference.

BACKGROUND OF THE INVENTION

Field of the Invention

The present invention relates to a stripping solution for photolithography which can be suitably used in manufacture of semiconductor elements such as IC and LSI as well as liquid crystal panel elements, and to a method for forming a pattern using the same.

Related Art

When semiconductor elements such as IC and LSI, or liquid crystal panel elements are manufactured, a CVD vapor-deposited metal film or an insulating film such as an $SiO_2$ film is first formed on a substrate such as a silicon wafer or glass. Next, a photoresist composition is uniformly applied on the metal film or the insulating film to form a photoresist film, and this photoresist film is selectively exposed and developed to form a photoresist pattern. Then, the substrate is subjected to an etching treatment using the photoresist pattern as a mask to form a fine circuit. Thereafter, the photoresist pattern is ashed, and residual materials of the ashed photoresist pattern, and etching residual materials are stripped away using a stripping solution for photolithography.

It is to be noted that aluminum (Al); an aluminum alloy (Al alloy) such as aluminum-silicon (Al—Si), aluminum-copper (Al—Cu) or aluminum-silicon-copper (Al—Si—Cu); titanium (Ti); a titanium alloy (Ti alloy) such as titanium nitride (TiN) or titanium tungsten (TiW); tantalum (Ta), tantalum nitride (TaN), tungsten (W), tungsten nitride (WN), copper (Cu) or the like may be used as the metal film described above. Furthermore, not only the metal film and the insulating film, an interlayer insulating film such as an organic SOG (spin-on glass) film may be also adopted. The metal film, insulating film, interlayer insulating film and the like are formed on the substrate as a single layer or a plurality of layers.

The stripping solution for photolithography is desired to have an ability to effectively strip residual materials of a photoresist pattern and etching residual materials, and be superior in anticorrosion properties on metals. In order to achieve both performances, use of hydrofluoric acid and a compound containing ammonia as a counter amine thereof (see Patent Documents 1 to 3), hydrofluoric acid and a compound containing 1,8-diazabicyclo[5.4.0]undecene-7 as a counter amine thereof (see Patent Document 4), or the like has been proposed so far.

Patent Document 1: Japanese Unexamined Patent Application, Publication No. 2001-83713

Patent Document 2: Japanese Unexamined Patent Application, Publication No. H9-197681

Patent Document 3: Japanese Unexamined Patent Application, Publication No. 2000-47401

Patent Document 4: Japanese Unexamined Patent Application, Publication No. 2000-181083

SUMMARY OF THE INVENTION

When residual materials of a photoresist pattern and etching residual materials are stripped, a stripping solution for photolithography may be recycled, and in such a case, the stripping solution for photolithography desirably has constant performance characteristics over time.

However, investigations performed by the present inventors revealed that continuous recycling of the stripping solution for photolithography for a long period of time disclosed in Patent Documents 1 to 4 leads to problems of: deteriorated performances of stripping residual materials of a photoresist pattern and etching residual materials as the composition alters; and progression of metal corrosion. In addition, when the stripping solution for photolithography is used under heating conditions in attempts to improve the stripping performances, the aforementioned problems were found to be more significant.

The present invention was made in view of the foregoing problems, and an object of the invention is to provide: a stripping solution for photolithography which can effectively strip residual materials of a photoresist pattern and etching residual materials, has superior anticorrosion properties on metals, and further can be continuously used for a long period of time; and a method for forming a pattern using the stripping solution.

The present inventors thoroughly investigated in order to solve the foregoing problems, with focusing on basic compounds as a counter amine of hydrofluoric acid contained in a stripping solution for photolithography. As a result, it was found that the foregoing problems can be solved by using a certain basic compound as a counter amine, and thus the present invention was accomplished. More specifically, provided by the present invention are as in the following.

A first aspect of the present invention provides a stripping solution for photolithography containing (A) hydrofluoric acid, (B) a basic compound represented by the following general formula (b-1), and (C) water.

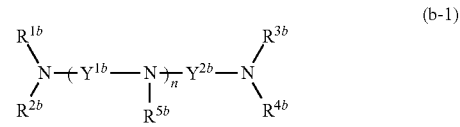

In the general formula (b-1), $R^{1b}$ to $R^{5b}$ each independently represent a hydrogen atom, or an alkyl group having 1 to 6 carbon atoms which may be substituted with a hydroxyl group, a carboxyl group, an amino group or a phosphonic acid group, and at least one of $R^{1b}$ to $R^{5b}$ represents a hydrogen atom;
one of $R^{1b}$ to $R^{4b}$ may bind with $R^{5b}$ to form a ring structure; $Y^{1b}$ and $Y^{2b}$ each independently represent an alkylene group having 1 to 3 carbon atoms; n is an integer of 0 to 5; and provided that n is 2 or greater, a plurality of $R^{5b}$s may be each the same or different and a plurality of $Y^{1b}$s may be each the same or different, and $R^{5b}$s may bind with each other to form a ring structure.

A second aspect of the present invention provides a method for forming a pattern, the method including: etching a substrate using a photoresist pattern provided on the substrate as a mask; then ashing the photoresist pattern; and thereafter stripping away the residual materials of the photoresist pattern and etching residual materials using the stripping solution for photolithography of the first aspect of the present invention.

According to the present invention, a stripping solution for photolithography which can effectively strip residual materials of a photoresist pattern and etching residual materials, has superior anticorrosion properties on metals, and further can be continuously used for a long period of time; and a method for forming a pattern using the stripping solution can be provided.

DETAILED DESCRIPTION OF THE INVENTION

Stripping Solution for Photolithography

The stripping solution for photolithography according to the present invention (hereinafter, merely referred to as "stripping solution") contains (A) hydrofluoric acid, (B) a basic compound, and (C) water. Each component contained in the stripping solution according to the present invention will be described in detail below.

(A) Hydrofluoric Acid

The stripping solution according to the present invention essentially contains hydrofluoric acid.

The content of hydrofluoric acid in the stripping solution is preferably 0.05 to 0.5% by mass, and more preferably 0.08 to 0.32% by mass. When the content of hydrofluoric acid falls within such a range, stripping properties of residual materials of a photoresist pattern and etching residual materials can be more effectively balanced with anticorrosion properties on metals.

(B) Basic Compound

The stripping solution according to the present invention essentially contains a basic compound represented by the following general formula (b-1):

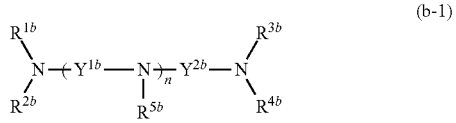

In the general formula (b-1), $R^{1b}$ to $R^{5b}$ each independently represent a hydrogen atom, or an alkyl group having 1 to 6 carbon atoms which may be substituted with a hydroxyl group, a carboxyl group, an amino group or a phosphonic acid group, and at least one of $R^{1b}$ to $R^{5b}$ represents a hydrogen atom;
one of $R^{1b}$ to $R^{4b}$ may bind with $R^{5b}$ to form a ring structure;
$Y^{1b}$ and $Y^{2b}$ each independently represent an alkylene group having 1 to 3 carbon atoms; n is an integer of 0 to 5; and provided that n is 2 or greater, a plurality of $R^{5b}$s may be each the same or different and a plurality of $Y^{1b}$s may be each the same or different, $R^{5b}$s may bind with each other to form a ring structure.

The alkyl group having 1 to 6 carbon atoms which may be included in $R^{1b}$ to $R^{5b}$ may be either linear or branched, and is preferably linear. Specific examples of the alkyl group having 1 to 6 carbon atoms include a methyl group, an ethyl group, a n-propyl group, a n-butyl group, a n-pentyl group, a n-hexyl group, and the like. Of these, an ethyl group is most preferred.

The alkyl group may be substituted with a hydroxyl group, a carboxyl group, an amino group, or a phosphonic acid group. Specific examples of such a substituted alkyl group include a 2-hydroxyethyl group, a 2-carboxyethyl group, a 2-aminoethyl group, an ethyl 2-phosphonate group, and the like.

The ring structure which may be formed by binding one of $R^{1b}$ to $R^{4b}$ with $R^{5b}$, or the ring structure which may be formed by binding of $R^{5b}$s with each other includes a piperazine ring, and the like.

The alkylene group having 1 to 3 carbon atoms which may be represented by $Y^{1b}$ and $Y^{2b}$ may be either linear or branched, and is preferably linear. Specific examples of the alkylene group include a methylene group, an ethylene group, a propylene group, and the like. Of these, an ethylene group is most preferred.

"n" is an integer of 0 to 5, and more preferably an integer of 0 to 2.

Specific examples of the basic compound represented by the above general formula (b-1) include ethylenediamine, N-(2-aminoethyl)-1,2-ethanediamine (i.e., diethylenetriamine), N,N'-bis(2-aminoethyl)-1,2-ethanediamine (i.e., triethylenetetramine), tris(2-aminoethyl)amine, N,N'-bis(2-aminoethyl)piperazine, N-[(2-aminoethyl)-2-aminoethyl]piperazine, N-(2-aminoethyl)-N'-{2-[(2-aminoethyl)amino]ethyl}-1,2-ethanediamine (i.e., tetraethylenepentamine), 4-(2-aminoethyl)-N-(2-aminoethyl)-N'-{2-[(2-aminoethyl)amino]ethyl}-1,2-ethanediamine, 1-(2-aminoethyl)-4-{[(2-aminoethyl)amino]ethyl}piperazine, 1-{2-[[2-[(2-aminoethyl)amino]ethyl]amino]ethyl}piperazine, 1-piperazineethanamine, 2-[(2-aminoethyl)amino]ethanol, diethylenetriamine pentaacetic acid, and the like.

Among the basic compounds represented by the above general formula (b-1), basic compounds represented by the following general formula (b-2) are preferred.

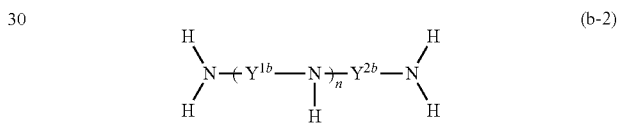

In the general formula (b-2), $Y^{1b}$, $Y^{2b}$, and n are as defined in the above general formula (b-1).

Specific examples of the basic compound represented by the above general formula (b-2) include ethylenediamine, N-(2-aminoethyl)-1,2-ethanediamine (i.e., diethylenetriamine), N,N'-bis(2-aminoethyl)-1,2-ethanediamine (i.e., triethylenetetramine), tetraethylene pentamine, pentaethylene hexamine, dimethylenetriamine, trimethylenetetramine, and the like.

Of these, N-(2-aminoethyl)-1,2-ethanediamine (i.e., diethylenetriamine), and N,N'-bis(2-aminoethyl)-1,2-ethanediamine (i.e., triethylenetetramine) have superior anticorrosion properties on metals, and thus are particularly preferred in that continuous use for a longer time period is enabled.

These basic compounds may be used alone, or in combination of two or more compounds.

The content of the basic compound represented by the above general formula (b-1) may be appropriately adjusted in accordance with the content of the hydrofluoric acid, and is preferably 0.01 to 2.00% by mass, and more preferably 0.01 to 1.24% by mass in the removing liquid. In addition, a ratio of the normality (N) of the basic compound to the normality (N) of the hydrofluoric acid is preferably 0.1 to 3.0, and more preferably 0.1 to 1.5. When the ratio falls within such a range, stripping properties of residual materials of a photoresist pattern and etching residual materials can be more effectively balanced with anticorrosion properties on metals, and further continuous use for a longer period of time is enabled.

(C) Water

The stripping solution according to the present invention essentially contains water.

The content of water in the stripping solution is preferably 1.0 to 80% by mass, and more preferably 15 to 40% by mass.

(D) Water Soluble Organic Solvent

The stripping solution according to the present invention may further contain a water soluble organic solvent.

The water soluble organic solvent is not particularly limited as long as it is miscible with water and other components, and a conventionally well-known water soluble organic solvent may be used. Specific examples of the water soluble organic solvent include: sulfoxides such as dimethylsulfoxide; sulfones such as dimethylsulfone, diethylsulfone, bis(2-hydroxyethyl)sulfone and tetramethylenesulfone; amides such as N,N-dimethylformamide, N-methylformamide, N,N-dimethylacetamide, N-methylacetamide and N,N-diethyl acetamide; lactams such as N-methyl-2-pyrrolidone, N-ethyl-2-pyrrolidone, N-propyl-2-pyrrolidone, N-hydroxymethyl-2-pyrrolidone and N-hydroxyethyl-2-pyrrolidone; imidazolidinones such as 1,3-dimethyl-2-imidazolidinone, 1,3-diethyl-2-imidazolidinone and 1,3-diisopropyl-2-imidazolidinone; lactones such as γ-butyrolactone and δ-valerolactone; polyhydric alcohols and derivatives thereof such as ethylene glycol, propylene glycol, ethylene glycol monomethyl ether, ethylene glycol monoethyl ether, ethylene glycol monobutyl ether, ethylene glycol monomethyl ether acetate, ethylene glycol monoethyl ether acetate, diethylene glycol, diethylene glycol monomethyl ether, diethylene glycol monoethyl ether and diethylene glycol monobutyl ether; and the like.

Of these, dimethylsulfoxide, N,N-dimethylformamide, N,N-dimethylacetamide, N-methyl-2-pyrrolidone, 1,3-dimethyl-2-imidazolidinone, ethylene glycol, propylene glycol and diethylene glycol monobutyl ether are preferred, and dimethylsulfoxide, N,N-dimethylformamide, N,N-dimethylacetamide, N-methyl-2-pyrrolidone, 1,3-dimethyl-2-imidazolidinone and propylene glycol are particularly preferred from the perspective of superior stripping properties of photoresist pattern and etching residual materials.

These water soluble organic solvents may be used alone, or in combination of two or more thereof.

When the water soluble organic solvent is contained, the content in the stripping solution is preferably 1.0 to 90% by mass, and more preferably 60 to 80% by mass.

Other Component

The stripping solution according to the present invention may further contain an anti-corrosion agent.

The anti-corrosion agent is not particularly limited, and a conventionally well-known anti-corrosion agent may be used, which is preferably a benzotriazole compound or a mercapto group-containing compound.

The benzotriazole compound includes compounds represented by the following general formula (e-1).

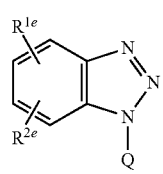

(e-1)

In the above general formula (e-1), $R^{1e}$ and $R^{2e}$ each independently represent a hydrogen atom, a hydrocarbon group having 1 to 10 carbon atoms which may include a substituent, a carboxyl group, an amino group, a hydroxyl group, a cyano group, a formyl group, a sulfonylalkyl group, or a sulfo group, and Q represents a hydrogen atom, a hydroxyl group, a hydrocarbon group having 1 to 14 carbon atoms which may include a substituent (wherein however, the hydrocarbon group may be interrupted by an amide bond or an ester bond), or a group represented by the following general formula (e-2).

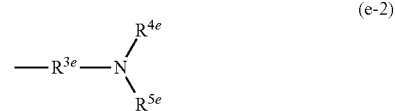

(e-2)

In the above general formula (e-2), $R^{3e}$ represents an alkylene group having 1 to 6 carbon atoms, and $R^{4e}$ and $R^{5e}$ each independently represent a hydrogen atom, a hydroxyl group, or a hydroxyalkyl group or an alkoxyalkyl group having 1 to 6 carbon atoms.

In each of the definitions of $R^{1e}$, $R^{2e}$ and Q in the above general formula (e-1), the hydrocarbon group may be either an aromatic hydrocarbon group or an aliphatic hydrocarbon group, may include an unsaturated bond, and may be a linear, branched or cyclic hydrocarbon group. The aromatic hydrocarbon group may be for example, a phenyl group, a p-tolyl group, or the like. The linear aliphatic hydrocarbon group may be for example, a methyl group, an n-propyl group, a vinyl group, or the like. The branched aliphatic hydrocarbon group may be for example, an i-butyl group, a t-butyl group, or the like. The cyclic aliphatic hydrocarbon group may be for example, a cyclopentyl group, a cyclohexyl group, or the like. The hydrocarbon group including a substituent may be for example, a hydroxyalkyl group, an alkoxyalkyl group, or the like.

Q in the above general formula (e-1) is preferably a group represented by the above general formula (e-2). In particular, of the groups represented by the above general formula (e-2), it is preferred that $R^{4e}$ and $R^{5e}$ be each independently selected from a hydroxyalkyl group or an alkoxyalkyl group having 1 to 6 carbon atoms.

Furthermore Q is preferably selected so that the compound represented by the above general formula (e-1) exhibits water-soluble properties. More specifically, a hydrogen atom, an alkyl group having 1 to 3 carbon atoms (i.e., a methyl group, an ethyl group, a propyl group or an isopropyl group), a hydroxyalkyl group having 1 to 3 carbon atoms, a hydroxyl group and the like are preferred.

The benzotriazole compound more specifically includes benzotriazole, 5,6-dimethylbenzotriazole, 1-hydroxybenzotriazole, 1-methylbenzotriazole, 1-aminobenzotriazole, 1-phenylbenzotriazole, 1-hydroxymethylbenzotriazole, methyl 1-benzotriazole carboxylate, 5-benzotriazole carboxylic acid, 1-methoxy-benzotriazole, 1-(2,2-dihydroxyethyl)-benzotriazole, 1-(2,3-dihydroxypropyl)benzotriazole; and 2,2'-{[(4-methyl-1H-benzotriazole-1-yl)methyl]imino}bisethanol, 2,2'-{[(5-methyl-1H-benzotriazole-1-yl)methyl]imino}bisethanol, 2,2'-{[(4-methyl-1H-benzotriazole-1-yl)methyl]imino}bisethane, 2,2'-{[(4-methyl-1H-benzotriazole-1-yl)methyl]imino}bispropane and the like that are commercially available from BASF as "IRE-GAMET" series.

Of the above compounds, 1-(2,3-dihydroxypropyl)-benzotriazole, 2,2'-{[(4-methyl-1H-benzotriazole-1-yl)methyl]

imino}bisethanol, 2,2'-{[(5-methyl-1H-benzotriazole-1-yl) methyl]imino}bisethanol, and the like are preferable.

These benzotriazole compounds may be used alone, or in combination of two or more compounds.

The mercapto group-containing compound above is preferably a compound containing a hydroxyl group and/or a carboxyl group on at least one of the $\alpha$-position and the $\beta$-position of a carbon atom that is bonded to the mercapto group. More specifically, such compounds include 1-thioglycerol, 3-(2-aminophenylthio)-2-hydroxypropylmercaptan, 3-(2-hydroxyethylthio)-2-hydroxypropylmercaptan, 2-mercaptopropionic acid, 3-mercaptopropionic acid, or the like. Of the above compounds, use of 1-thioglycerol is particularly preferred.

These mercapto group-containing compounds may be used alone, or in combination of two or more compounds.

When the anti-corrosion agent is contained, the content in the stripping solution is preferably 0.1 to 10% by mass, and more preferably 0.5 to 5% by mass.

Also, the stripping solution according to the present invention may further contain a surfactant.

The surfactant is not particularly limited, and a conventionally well-known surfactant may be used, which is preferably an acetylene alcohol based surfactant.

When the surfactant is contained, the content in the stripping solution is preferably 0.01 to 5% by mass, and more preferably 0.05 to 2% by mass.

Due to essentially containing the components (A) to (C), the stripping solution according to the present invention can have stripping properties of residual materials of a photoresist pattern and etching residual materials effectively balanced with anticorrosion properties on metals (particularly Al and Al alloys). Therefore, the stripping solution according to the present invention can be suitably used in forming metal wiring patterns configured with Al or an Al alloy, for example.

In addition, the stripping solution according to the present invention is less likely to be accompanied by alteration of the composition even if continuously used for a long period of time; therefore, the present stripping solution is suitable in the case of recycling a stripping solution.

Method for Forming a Pattern

The method for forming a pattern according to the present invention includes: etching a substrate using a photoresist pattern provided on the substrate as a mask; then ashing the photoresist pattern; and thereafter stripping away the residual materials of the photoresist pattern and etching residual materials using the stripping solution according to the present invention. Hereinafter, one example of the method for forming a pattern according to the present invention will be explained in detail.

First, a photoresist composition is applied on a substrate on which a metal film has been formed, and the photoresist composition is dried to form a photoresist film.

The substrate on which a metal film has been formed is exemplified by substrates on which a metal film has been formed, the metal being aluminum (Al); an aluminum alloy (Al alloy) such as aluminum-silicon (Al—Si), aluminum-copper (Al—Cu) or aluminum-silicon-copper (Al—Si—Cu); titanium (Ti); a titanium alloy (Ti alloy) such as titanium nitride (TiN) or titanium tungsten (TiW); tantalum (Ta), tantalum nitride (TaN), tungsten (W), tungsten nitride (WN), copper (Cu) or the like. The method for forming a pattern according to the present invention is particularly suited in the case in which metal film configured with Al or an Al alloy has been formed on a substrate.

Furthermore, the photoresist composition is exemplified by: (i) a positive photoresist composition containing a naphthoquinonediazide compound and a novolak resin; (ii) a positive photoresist composition containing a compound that generates an acid by exposure, a compound that increases its solubility in an aqueous alkali solution through decomposition by an acid, and an alkali-soluble resin; (iii) a positive photoresist composition containing a compound that generates an acid by exposure, and an alkali-soluble resin having a group that increases its solubility in an aqueous alkali solution through decomposition by an acid; and (iv) a negative photoresist composition containing a compound that generates an acid by exposure, a crosslinking agent, and an alkali-soluble resin, and the like, but not limited thereto.

Next, the photoresist film is selectively exposed. The exposure may be carried out on the photoresist film with a light source that emits an actinic radiation such as an ultraviolet ray, a far ultraviolet ray, an excimer laser, an X-ray or an electron beam, for example, a low-pressure mercury lamp, a high-pressure mercury lamp, an ultrahigh-pressure mercury lamp, a xenon lamp or the like through a desired mask pattern, or an electron beam may be directly irradiated on the photoresist film.

Thereafter, a heat treatment (PEB) is carried out as needed.

Next, the exposed photoresist film is developed using a developer solution to obtain a predetermined photoresist pattern. The development method may be an immersion method, a puddling method, a spray coating method, and the like.

Thereafter, a heat treatment (post-baking) is carried out if necessary.

Subsequently, using the formed photoresist pattern as a mask, the metal film is selectively etched. The etching may be any one of wet etching and dry etching, or a combination thereof, but dry etching is preferred.

Next, the photoresist pattern is ashed.

It is to be noted that etching residual materials, as well as residual materials of modified photoresist pattern often remain on the ashed substrate.

Then, the residual materials of the photoresist pattern and etching residual materials are stripping away using the stripping solution according to the present invention. In the case in which a metal film configured with Al or an Al alloy is formed on the substrate, the residual materials may include $Al_2O_3$, $AlCl_3$, $AlF_3$, $SiO_2$, and the like. The method for stripping is exemplified by an immersion method, a spray coating method and the like, and the treatment may be carried out by either a batch-wise processing or a single wafer processing. Time period for the stripping is not particularly limited, and is typically about 10 to 30 min in a batch-wise processing and about 0.5 to 3 min in a single wafer processing. The stripping solution according to the present invention is preferably used in a single wafer processing. The temperature of the stripping solution is not particularly limited, and is typically about 25 to 70° C.

Thereafter, a rinse treatment with pure water, a lower alcohol or the like, and a dry treatment may be also carried out.

The foregoing steps enable a metal wiring pattern to be formed on the substrate.

EXAMPLES

Hereinafter, the present invention will be explained in more detail by way of Examples of the present invention, but the present invention is not limited to the following Examples.

(Preparation of Removing Liquid)

Stripping solutions were prepared in accordance with compositions and amounts blended as shown in Tables 1 to 5 below. It is to be noted that each reagent employed was a commercially available product in general, unless otherwise stated in particular. In addition, the value in parentheses in Tables is presented by a unit on a basis of % by mass, unless otherwise stated in particular.

TABLE 1

|  | Hydrofluoric acid | Basic compound | Ratio of normality (basic compound/hydrofluoric acid) | Water | Water soluble organic solvent |
|---|---|---|---|---|---|
| Example 1 | HF (0.12) | DETA (0.05) | 0.25 | Water (25) | NMP (Remainder) |
| Example 2 | HF (0.24) | DETA (0.11) | 0.25 | Water (25) | NMP (Remainder) |
| Example 3 | HF (0.15) | TETA (0.07) | 0.26 | Water (25) | NMP (Remainder) |
| Example 4 | HF (0.24) | TETA (0.07) | 0.16 | Water (25) | NMP (Remainder) |
| Example 5 | HF (0.12) | DETA (0.05) | 0.25 | Water (25) | DMAC (Remainder) |
| Example 6 | HF (0.12) | DETA (0.05) | 0.25 | Water (25) | PG (Remainder) |
| Example 7 | HF (0.12) | DETA (0.05) | 0.25 | Water (25) | DMSO (Remainder) |
| Example 8 | HF (0.32) | DETA (0.14) | 0.25 | Water (25) | NMP (Remainder) |
| Example 9 | HF (0.08) | DETA (0.01) | 0.10 | Water (25) | NMP (Remainder) |
| Example 10 | HF (0.12) | DETA (0.02) | 0.10 | Water (25) | NMP (Remainder) |

TABLE 2

|  | Hydrofluoric acid | Basic compound | Ratio of normality (basic compound/hydrofluoric acid) | Water | Water soluble organic solvent |
|---|---|---|---|---|---|
| Example 11 | HF (0.16) | DETA (0.03) | 0.10 | Water (25) | NMP (Remainder) |
| Example 12 | HF (0.32) | DETA (0.06) | 0.10 | Water (25) | NMP (Remainder) |
| Example 13 | HF (0.08) | DETA (0.03) | 0.25 | Water (25) | NMP (Remainder) |
| Example 14 | HF (0.16) | DETA (0.07) | 0.25 | Water (25) | NMP (Remainder) |
| Example 15 | HF (0.20) | DETA (0.08) | 0.25 | Water (25) | NMP (Remainder) |
| Example 16 | HF (0.28) | DETA (0.12) | 0.25 | Water (25) | NMP (Remainder) |
| Example 17 | HF (0.12) | DETA (0.10) | 0.50 | Water (25) | NMP (Remainder) |
| Example 18 | HF (0.16) | DETA (0.14) | 0.50 | Water (25) | NMP (Remainder) |
| Example 19 | HF (0.24) | DETA (0.21) | 0.50 | Water (25) | NMP (Remainder) |
| Example 20 | HF (0.24) | DETA (0.31) | 0.75 | Water (25) | NMP (Remainder) |

TABLE 3

|  | Hydrofluoric acid | Basic compound | Ratio of normality (basic compound/hydrofluoric acid) | Water | Water soluble organic solvent |
|---|---|---|---|---|---|
| Example 21 | HF (0.12) | DETA (0.21) | 1.0 | Water (25) | NMP (Remainder) |
| Example 22 | HF (0.16) | DETA (0.28) | 1.0 | Water (25) | NMP (Remainder) |
| Example 23 | HF (0.24) | DETA (0.42) | 1.0 | Water (25) | NMP (Remainder) |
| Example 24 | HF (0.12) | DETA (0.31) | 1.5 | Water (25) | NMP (Remainder) |
| Example 25 | HF (0.16) | DETA (0.41) | 1.5 | Water (25) | NMP (Remainder) |
| Example 26 | HF (0.24) | DETA (0.63) | 1.5 | Water (25) | NMP (Remainder) |
| Example 27 | HF (0.24) | DETA (0.73) | 1.75 | Water (25) | NMP (Remainder) |
| Example 28 | HF (0.24) | DETA (0.84) | 2.0 | Water (25) | NMP (Remainder) |
| Example 29 | HF (0.24) | DETA (1.05) | 2.5 | Water (25) | NMP (Remainder) |
| Example 30 | HF (0.12) | DETA (0.62) | 3.0 | Water (25) | NMP (Remainder) |
| Example 31 | HF (0.24) | DETA (1.24) | 3.0 | Water (25) | NMP (Remainder) |

TABLE 4

|  | Hydrofluoric acid | Basic compound | Ratio of normality (basic compound/hydrofluoric acid) | Water | Water soluble organic solvent |
|---|---|---|---|---|---|
| Comparative Example 1 | HF (0.24) | — | 0.0 | Water (25) | NMP (Remainder) |
| Comparative Example 2 |  | $NH_4F$ (0.45) | 1.0 | Water (25) | NMP (Remainder) |
| Comparative Example 3 | HF (0.24) | $NH_3$ (0.10) | 0.50 | Water (25) | NMP (Remainder) |
| Comparative Example 4 | HF (0.24) | MEA (0.73) | 1.0 | Water (25) | NMP (Remainder) |
| Comparative Example 5 | HF (0.24) | MEA (0.37) | 0.50 | Water (25) | NMP (Remainder) |
| Comparative Example 6 | HF (0.24) | TEtA (1.79) | 1.0 | Water (25) | NMP (Remainder) |
| Comparative Example 7 | HF (0.24) | TEtA (0.90) | 0.50 | Water (25) | NMP (Remainder) |

TABLE 4-continued

|  | Hydrofluoric acid | Basic compound | Ratio of normality (basic compound/hydrofluoric acid) | Water | Water soluble organic solvent |
|---|---|---|---|---|---|
| Comparative Example 8 | HF (0.24) | Butylamine (0.87) | 1.0 | Water (25) | NMP (Remainder) |
| Comparative Example 9 | HF (0.24) | Isoamylamine (1.04) | 1.0 | Water (25) | NMP (Remainder) |
| Comparative Example 10 | HF (0.24) | Dimethyldodecyl amine (2.22) | 1.0 | Water (25) | NMP (Remainder) |

TABLE 5

|  | Hydrofluoric acid | Basic compound | Ratio of normality (basic compound/hydrofluoric acid) | Water | Water soluble organic solvent |
|---|---|---|---|---|---|
| Comparative Example 11 | HF (0.24) | DBU (1.82) | 1.0 | Water (25) | NMP (Remainder) |
| Comparative Example 12 | HF (0.24) | Benzotriazole (1.43) | 1.0 | Water (25) | NMP (Remainder) |
| Comparative Example 13 | HF (0.24) | Pyridine (0.95) | 1.0 | Water (25) | NMP (Remainder) |
| Comparative Example 14 | HF (0.24) | DL-alaninol (0.90) | 1.0 | Water (25) | NMP (Remainder) |
| Comparative Example 15 | HF (0.12) | PMDETA (0.08) | 0.25 | Water (25) | NMP (Remainder) |
| Comparative Example 16 | HF (0.24) | PMDETA (0.17) | 0.25 | Water (25) | NMP (Remainder) |
| Comparative Example 17 | HF (0.15) | PMDETA (0.07) | 0.25 | Water (25) | NMP (Remainder) |
| Comparative Example 18 | HF (0.08) | — | 0.0 | Water (25) | NMP (Remainder) |
| Comparative Example 19 | HF (0.12) | — | 0.0 | Water (25) | NMP (Remainder) |
| Comparative Example 20 | HF (0.32) | — | 0.0 | Water (25) | NMP (Remainder) |

Abbreviations in the above Tables 1 to 5 are as shown below.
DETA: diethylenetriamine
TETA: triethylenetetramine
MEA: monoethanolamine
TEtA: triethanolamine
DBU: 1,8-diazabicyclo[5.4.0]undecene-7
PMDETA: pentamethyldiethylenetriamine
NMP: N-methyl-2-pyrrolidone
DMAC: N,N-dimethylacetamide
PG: propylene glycol
DMSO: dimethylsulfoxide (Alteration of Film Thickness of Al—Si—Cu Film)

A silicon wafer on which an Al—Si—Cu film having a thickness of about 0.3 μm had been vapor deposited was immersed in a stripping solution warmed to 25° C. or 35° C. for 10 min, and the amount of the alteration of the film thickness after immersion as compared with before the immersion was determined. The results are shown in Tables 6 to 8.

(Stripping Characteristics and Anticorrosion Properties)

TFR-H (manufactured by Tokyo Ohka Kogyo Co., Ltd.) that is a photoresist composition for TFT was spin-coated on a silicon wafer on which an Al—Si—Cu film having a thickness of about 0.3 μm had been vapor deposited, and prebaked at 90° C. for 90 sec to form a photoresist film having a film thickness of 2.0 μm. This photoresist film was irradiated with an ultraviolet ray using a stepper NSR-2005i10D (manufactured by Nikon Corporation) through a mask pattern, and developed with a 2.38% by weight aqueous tetramethylammonium hydroxide solution, followed by subjecting to post-baking at 150° C. for 90 sec to obtain a line-and-space photoresist pattern having a thickness of 0.6 μm.

Thereafter, the Al—Si—Cu film was etched with a mixed gas of chlorine and boron trichloride as an etchant using an etching apparatus TSS-6000 (manufactured by Tokyo Ohka Kogyo Co., Ltd.) under a pressure of 5 mmTorr and a stage temperature of 20° C. for 168 sec on the substrate on which the photoresist pattern had been formed, whereby an Al—Si—Cu wiring pattern was formed. Then, an after corrosion treatment was carried out using a mixed gas of oxygen and trifluoromethane under a pressure of 20 mmTorr, at a stage temperature of 20° C. for 30 sec.

Next, the photoresist pattern was ashed using an ashing apparatus TCA-3822 (manufactured by Tokyo Ohka Kogyo Co., Ltd.) under a pressure of 1.2 mmTorr, at a stage temperature of 220° C. for 40 sec.

Subsequently, the ashed silicon wafer was immersed for 45 sec in the stripping solution warmed to 35° C. in a single wafer processing to strip away residual materials of the photoresist pattern and etching residual materials. Then, anticorrosion properties were evaluated as: "A" when corrosion of the Al—Si—Cu wiring pattern was not found; and "B" when the corrosion was found. In addition, the silicon wafer after subjecting to the stripping treatment was observed by an optical microscope and a scanning electron microscope (SEM), and stripping characteristics were evaluated as: "A" when residual materials of the photoresist pattern and etching residual materials did not remain; and "B" when the residual materials remained. The results are shown in Tables 6 to 8. It is to be noted that in the case in which the anticorrosion properties were evaluated as "B", corrosion excessively progressed and thus observation of residual materials of the photoresist pattern and etching residual materials failed; therefore, the denotation of the evaluation of the stripping characteristics was "NA" in Tables.

(Alteration of Etching Rate)

A silicon wafer on which an $Al_2O_3$ film having a thickness of about 0.2 μm had been vapor deposited was immersed for 10 min in the stripping solution warmed to 35° C., and an etching rate (Å/min) was calculated from the alteration of the film thickness after the immersion as compared to that before the immersion. In addition, an etching rate (Å/min) was calculated in a similar manner to that described above using the stripping solution which had been continuously warmed at 35° C. over 48 hrs. Then, the evaluation was made as: "A" when the amount of the alteration of the etching rate was less than 10 Å/min; and as "B" when the amount of the alteration was no less than 10 Å/min. The results are shown in Tables 6 to 8.

(Alteration of Composition)

The stripping solution was warmed at 35° C. for 48 hrs, and the change of the concentration of the basic compound after the warming as compared with that before warming was determined. Then, the evaluation was made as "A" when the change of the concentration was less than 0.15%; and as "B" when the change was no less than 0.15%. The results are shown in Tables 6 to 8.

TABLE 6

|  | Alteration of Al—Si—Cu film thickness (nm) (treatment at 25° C. for 10 min) | Alteration of Al—Si—Cu film thickness (nm) (treatment at 35° C. for 10 min) | Stripping characteristics | Anticorrosion properties | Alteration of etching rate | Alteration of compositon |
|---|---|---|---|---|---|---|
| Example 1 | <0.1 | <0.1 | A | A | A | A |
| Example 2 | — | <0.1 | A | A | A | A |
| Example 3 | — | 1.2 | A | A | A | A |
| Example 4 | — | <0.1 | A | A | A | A |
| Example 5 | — | <0.1 | A | A | A | A |
| Example 6 | — | <0.1 | A | A | A | A |
| Example 7 | — | <0.1 | A | A | A | A |
| Example 8 | — | 0.18 | A | A | A | A |
| Example 9 | — | 1.2 | A | A | A | A |
| Example 10 | — | <0.1 | A | A | A | A |
| Example 11 | — | 1.16 | A | A | A | A |
| Example 12 | — | 0.7 | A | A | A | A |
| Example 13 | — | <0.1 | A | A | A | A |
| Example 14 | — | <0.1 | A | A | A | A |
| Example 15 | — | 4.5 | A | A | A | A |
| Example 16 | — | 0.7 | A | A | A | A |
| Example 17 | — | 2.32 | A | A | A | A |
| Example 18 | — | 3.2 | A | A | A | A |
| Example 19 | — | 9.8 | A | A | A | A |
| Example 20 | — | 9.7 | A | A | A | A |

TABLE 7

|  | Alteration of Al—Si—Cu film thickness (nm) (treatment at 25° C. for 10 min) | Alteration of Al—Si—Cu film thickness (nm) (treatment at 35° C. for 10 min) | Stripping characteristics | Anticorrosion properties | Alteration of etching rate | Alteration of compositon |
|---|---|---|---|---|---|---|
| Example 21 | — | 10.6 | A | A | A | A |
| Example 22 | — | 16.0 | A | A | A | A |
| Example 23 | — | 22.1 | A | A | A | A |
| Example 24 | — | 9.2 | A | A | A | A |
| Example 25 | — | 14.6 | A | A | A | A |
| Example 26 | — | <0.1 | A | A | A | A |
| Example 27 | — | 16.6 | A | A | A | A |
| Example 28 | — | 15.7 | A | A | A | A |
| Example 29 | — | 13.4 | A | A | A | A |
| Example 30 | — | 6.7 | A | A | A | A |
| Example 31 | — | 11.1 | A | A | A | A |

TABLE 8

| | Alteration of Al—Si—Cu film thickness (nm) (treatment at 25° C. for 10 min) | Alteration of Al—Si—Cu film thickness (nm) (treatment at 35° C. for 10 min) | Stripping characteristics | Anticorrosion properties | Alteration of etching rate | Alteration of compositon |
|---|---|---|---|---|---|---|
| Comparative Example 1 | — | 40.3 | NA | B | A | A |
| Comparative Example 2 | — | <0.1 | A | A | B | B |
| Comparative Example 3 | — | <0.1 | A | A | B | B |
| Comparative Example 4 | — | 33.5 | NA | B | A | A |
| Comparative Example 5 | — | 52.3 | NA | B | A | A |
| Comparative Example 6 | — | 35.0 | NA | B | A | A |
| Comparative Example 7 | — | 36.8 | NA | B | A | A |
| Comparative Example 8 | 9.0 | — | NA | B | A | A |
| Comparative Example 9 | 5.4 | — | NA | B | A | A |
| Comparative Example 10 | 13.1 | — | NA | B | A | A |
| Comparative Example 11 | 11.4 | — | NA | B | A | A |
| Comparative Example 12 | 10.3 | — | NA | B | A | A |
| Comparative Example 13 | 54.0 | — | NA | B | A | A |
| Comparative Example 14 | 11.0 | — | NA | B | A | A |
| Comparative Example 15 | — | 19.8 | NA | B | A | A |
| Comparative Example 16 | — | 23.6 | NA | B | A | A |
| Comparative Example 17 | — | 17.5 | NA | B | A | A |
| Comparative Example 18 | — | 0.8 | NA | B | B | B |
| Comparative Example 19 | — | 21.9 | NA | B | B | B |
| Comparative Example 20 | — | 59.7 | NA | B | B | B |

As is seen from Tables 6 to 8, the stripping solutions of Examples 1 to 31 containing the basic compound represented by the above general formula (b-1) as a counter amine of hydrofluoric acid enabled effective stripment of the residual materials of the photoresist pattern and the etching residual materials, and exhibited superior anticorrosion properties on Al—Si—Cu. Moreover, even if the stripping solutions of Examples 1 to 31 were warmed at 35° C. for a long period of time, the alteration of etching rate and the alteration of composition scarcely occurred, indicating that these stripping solutions were suited for recycling.

On the other hand, the stripping solution of Comparative Example 2 containing ammonium fluoride, and the stripping solution of Comparative Example 3 containing ammonia as a counter amine of hydrofluoric acid enabled effective stripment of the residual materials of the photoresist pattern and the etching residual materials, and exhibited superior anticorrosion properties on Al—Si—Cu; however, warming at 35° C. for a long period of time resulted in the alteration of etching rate and the alteration of composition, indicating that these stripping solutions were not suited for recycling. In addition, the stripping solutions of Comparative Examples 1 and 18 to 20 not containing the basic compound, and the stripping solutions of Comparative Examples 4 to 17 containing a basic compound other than ammonia as a counter amine of hydrofluoric acid exhibited inferior anticorrosion properties on Al—Si—Cu.

What is claimed is:

1. A stripping solution for photolithography consisting essentially of (A) hydrofluoric acid, (B) at least one of diethylenetriamine and triethylenetetramine; (C) water; and (D) at least one water soluble organic solvent selected from the group consisting of N-methyl-2-pyrrolidone, N,N-dimethylacetamide, and propylene glycol, wherein a ratio of the normality of the at least one of diethylenetriamine and triethylenetetramine to the normality of the hydrofluoric acid is 0.1 to 3.0.

2. A method for forming a pattern, the method comprising: etching a substrate using a photoresist pattern provided on the substrate as a mask; then ashing the photoresist pattern; and thereafter stripping away residual materials of the photoresist pattern and etching residual materials using the stripping solution for photolithography according to claim 1.

3. The stripping solution for photolithography according to claim 1, wherein the content of hydrofluoric acid is 0.05 to 0.5% by mass, the content of the at least one of diethylenetriamine and triethylenetriamine is 0.01 to 2.00% by mass, and the content of water is 1.0 to 80% by mass.

* * * * *